(12) United States Patent
Jochim et al.

(10) Patent No.: US 10,785,895 B2
(45) Date of Patent: Sep. 22, 2020

(54) MANAGING A DATA CENTER

(71) Applicant: Google LLC, Mountain View, CA (US)

(72) Inventors: Jayson Michael Jochim, Mountain View, CA (US); Michael Chi Kin Lau, San Francisco, CA (US); Bill Dailey, Redwood City, CA (US); Angela Chen, Mountain View, CA (US); Winnie Leung, Palo Alto, CA (US); Peter Pellerzi, Greenwich, CT (US); Soheil Farshchian, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/724,923

(22) Filed: Oct. 4, 2017

(65) Prior Publication Data
US 2019/0104636 A1  Apr. 4, 2019

(51) Int. Cl.
H05K 7/20 (2006.01)
H05K 7/14 (2006.01)

(52) U.S. Cl.
CPC ....... H05K 7/20745 (2013.01); H05K 7/1489 (2013.01); H05K 7/1492 (2013.01); H05K 7/1497 (2013.01)

(58) Field of Classification Search
CPC ....... G06F 1/181–182; H05K 7/20218–20381; H05K 7/20409–20418;
(Continued)

(56) References Cited

U.S. PATENT DOCUMENTS 3,924,370 A  12/1975 Cauceglia et al.
4,992,669 A  2/1991 Parmley
(Continued)

FOREIGN PATENT DOCUMENTS

CN  1543758 A  11/2004
CN  1732727 A  2/2006
(Continued)

OTHER PUBLICATIONS

'www.werc.org' [online] "TranSystems: 11th Edition Rules of Thumb Warehousing & Distribution Guidelines," Available on or before Dec. 13, 2011, [retrieved on Jan. 4, 2018] Retrieved from Internet: URL<http://www.werc.org/assets/1/Publications/TranSystems%20Rules%2003/020Thumb%202010%20v2.pdf> via the Wayback Machine at Internet: URL<https://web.archive.org/web/20110901000000 */http://www.werc.org/assets/1/Publications/TranSystems%20Rules%20of%20Thumb%202010%20v2.pdf> 16 pages.

(Continued)

Primary Examiner — Robert J Hoffberg
(74) Attorney, Agent, or Firm — Fish & Richardson P.C.

(57) ABSTRACT

A data center system includes a frame assembly that includes a plurality of bays defined along a lengthwise dimension of the frame assembly, the plurality of bays arranged in a plurality of stacked layers of bays, the plurality of stacked layers including at least a first layer of bays and a second layer of bays positioned vertically above the first layer of bays; a plurality of server racks positioned in the bays of the first layer of bays, each of the server racks configured to support a plurality of data center server devices that define a particular amount of computing power; and a plurality of network switches positioned in the bays of the second layer of bays, each of the network switches communicably coupled to at least one of the data center server devices in the first layer of bays.

21 Claims, 8 Drawing Sheets

(58) Field of Classification Search
CPC ..... H05K 7/20009–202; H05K 7/1489; H05K 7/1492; H05K 7/20736; H05K 7/1497; H05K 7/2059; H05K 7/20654; H05K 7/2069; H05K 7/20745; H05K 7/2079; H05K 7/20827; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | |
|---|---|---|---|
| 5,345,779 | A | 9/1994 | Feeney |
| 5,953,930 | A | 9/1999 | Chu et al. |
| 6,374,627 | B1 | 4/2002 | Schumacher et al. |
| 6,819,563 | B1 | 11/2004 | Chu et al. |
| 6,859,366 | B2 | 2/2005 | Fink et al. |
| 7,011,576 | B2 | 3/2006 | Sharp et al. |
| 8,763,414 | B2 | 7/2014 | Carlson et al. |
| 8,867,204 | B1 * | 10/2014 | Gardner ............... H05K 7/1497 361/679.46 |
| 9,572,288 | B2 * | 2/2017 | Wilcox ............. H05K 7/20745 |
| 9,585,282 | B1 * | 2/2017 | Gandhi ............... H05K 7/1498 |
| 9,606,316 | B1 * | 3/2017 | Gandhi .................. H05K 7/18 |
| 9,850,655 | B2 * | 12/2017 | Matori ................. H05K 7/1492 |
| 10,172,261 | B2 * | 1/2019 | Wilcox ............... E04B 1/34807 |
| 10,212,851 | B2 * | 2/2019 | Rimler ............... H05K 7/20709 |
| 10,548,244 | B2 * | 1/2020 | Rimler ................. H05K 7/1488 |
| 2002/0055329 | A1 | 5/2002 | Storck, Jr. et al. |
| 2004/0132398 | A1 | 7/2004 | Sharp et al. |
| 2005/0051505 | A1 * | 3/2005 | Lewis ..................... B65G 1/06 211/151 |
| 2005/0170770 | A1 | 8/2005 | Johnson et al. |
| 2007/0171613 | A1 | 7/2007 | McMahan et al. |
| 2007/0281639 | A1 * | 12/2007 | Clidaras .................. G06F 1/20 455/128 |
| 2008/0055850 | A1 * | 3/2008 | Carlson .................. G06F 1/20 361/695 |
| 2008/0164794 | A1 | 7/2008 | Lai et al. |
| 2008/0212273 | A1 * | 9/2008 | Bechtolsheim ......... G06F 1/183 361/679.33 |
| 2010/0091449 | A1 * | 4/2010 | Clidaras .................. G06F 1/20 361/679.49 |
| 2011/0235272 | A1 * | 9/2011 | Bash ................. H05K 7/20609 361/692 |
| 2011/0239680 | A1 * | 10/2011 | Dechene ................. E04H 5/02 62/259.2 |
| 2011/0240497 | A1 * | 10/2011 | Dechene ................. E04H 5/02 206/320 |
| 2012/0164930 | A1 | 6/2012 | Murayama et al. |
| 2014/0014292 | A1 * | 1/2014 | Rice ................. H05K 7/20745 165/11.1 |
| 2015/0036293 | A1 * | 2/2015 | Martini ................ F24F 11/0001 361/695 |
| 2015/0053629 | A1 * | 2/2015 | Elwany ............. H05K 7/20736 211/26 |
| 2015/0114027 | A1 * | 4/2015 | Kinkel ...................... F25D 7/00 62/426 |
| 2015/0177808 | A1 * | 6/2015 | Sarti ......................... G06F 1/30 713/300 |
| 2015/0189787 | A1 * | 7/2015 | Bailey .................. H05K 7/1489 361/679.48 |
| 2015/0195958 | A1 * | 7/2015 | Keisling ............ H05K 7/20745 361/679.47 |
| 2015/0309674 | A1 * | 10/2015 | Williams ............. G02B 6/4452 715/845 |
| 2015/0342094 | A1 * | 11/2015 | Ross ................... H05K 7/20736 361/679.46 |
| 2016/0135323 | A1 * | 5/2016 | Haroun ................ H05K 7/1485 361/679.53 |
| 2016/0135329 | A1 * | 5/2016 | Lewis, II ........... H05K 7/20745 361/692 |
| 2017/0231108 | A1 * | 8/2017 | Mick ................... G05D 23/1917 |
| 2017/0245390 | A1 * | 8/2017 | Larson ................. H05K 7/1492 |
| 2017/0280593 | A1 * | 9/2017 | Magallanes ........ H05K 7/20736 |
| 2017/0332507 | A1 * | 11/2017 | Adrian ................. G11B 33/128 |
| 2017/0347497 | A1 * | 11/2017 | LeFebvre ........... H05K 7/20836 |
| 2017/0374767 | A1 * | 12/2017 | Shelnutt ............. H05K 7/20781 |
| 2018/0063990 | A1 * | 3/2018 | Malone ............... H05K 7/20736 |
| 2018/0160566 | A1 * | 6/2018 | Branton .............. H05K 7/20254 |
| 2018/0192550 | A1 * | 7/2018 | Noteboom ......... H05K 7/20745 |
| 2018/0338393 | A1 * | 11/2018 | Curtin ................ H05K 7/20745 |
| 2019/0073148 | A1 * | 3/2019 | Adrian .................. G06F 3/0629 |
| 2019/0104637 | A1 * | 4/2019 | Jochim ................. H05K 7/1494 |
| 2019/0261534 | A1 * | 8/2019 | Jochim ................. H05K 7/1492 |

FOREIGN PATENT DOCUMENTS

| | | |
|---|---|---|
| EP | 2916633 | 9/2015 |
| GB | 2370293 | 6/2002 |
| JP | 11148710 | 6/1996 |
| JP | 2003035411 | 2/2003 |
| WO | WO2007139560 A1 | 12/2007 |
| WO | WO 2016/131138 | 8/2016 |

OTHER PUBLICATIONS

PCT International Search Report and Written Opinion issued in International Application No. PCT/US2018/053476, dated Jan. 11, 2019, 13 pages.

PCT International Preliminary Report on Patentability in International Application No. PCT/US2018/053476, dated Apr. 8, 2020, 8 pages.

* cited by examiner

MANAGING A DATA CENTER

TECHNICAL FIELD

The present disclosure relates to systems and methods for managing a data center and, more particularly, managing networking connections and servicing of electronic computing devices in a data center.

BACKGROUND

Planning for and provisioning physical network infrastructure resources for a large scale data center deployment is a challenging task. Co-locating networking switches and information technology (IT) equipment racks in the same space results in inefficiencies and reduced flexibility. For example, networking provisioning may cause underutilization of power, cooling, and space resources. Further, networking equipment often has higher availability requirements due to their potential to impact larger failure domains. In some cases, complex networking cable routes and non-optimal cable path lengths occur due to cable tray conveyance in multiple elevations in a grid configuration above IT equipment. Such circumstances may also cause inflexibility to experiment with alternative network topologies.

SUMMARY

In a general implementation, a data center system includes a frame assembly that includes a plurality of bays defined along a lengthwise dimension of the frame assembly, the plurality of bays arranged in a plurality of stacked layers of bays, the plurality of stacked layers including at least a first layer of bays and a second layer of bays positioned vertically above the first layer of bays; a plurality of server racks positioned in the bays of the first layer of bays, each of the server racks configured to support a plurality of data center server devices that define a particular amount of computing power; and a plurality of network switches positioned in the bays of the second layer of bays, each of the network switches communicably coupled to at least one of the data center server devices in the first layer of bays.

In an aspect combinable with the general implementation, the plurality of bays are further arranged in a third layer of bays that is positioned vertically between the first and the second layers of bays.

In another aspect combinable with any of the previous aspects, another plurality of server racks are positioned in the bays of the third layer of bays, each of the other plurality server racks is configured to support another plurality of data center server devices that define an additional amount of computing power.

Another aspect combinable with any of the previous aspects further includes at least one cooling unit sized for a bay of the plurality of bays of the frame assembly and configured to circulate a heated airflow from an open back side of a particular server rack, cool the heated air, and circulate a cooling airflow through an open front side of the particular server rack.

In another aspect combinable with any of the previous aspects, each bay includes a volume defined at least in part by a specified height that is orthogonal to the lengthwise dimension and a specified width that is parallel to the lengthwise dimension and sized to at least partially enclose at least one server rack.

In another aspect combinable with any of the previous aspects, the specified width and the specified height of the bay are based on a form factor of the at least one server rack.

In another aspect combinable with any of the previous aspects, at least one perimeter dimension of the cooling unit is based on a form factor of the at least one server rack.

In another aspect combinable with any of the previous aspects, the at least one server rack includes two server racks, each of the two server racks providing between 5 kW and 100 kW of computing power.

In another aspect combinable with any of the previous aspects, at least a portion of the frame assembly that defines the bays of the second layer of bays is configured to mount on a support surface of a data center building.

In another aspect combinable with any of the previous aspects, the support surface includes a structural steel mezzanine.

In another aspect combinable with any of the previous aspects, the frame assembly includes a first portion that defines the first layer of bays; a second portion stacked on top of the first portion that defines the second layer of bays; and a third portion stacked on top of the second portion that defines the third layer of bays.

In another general implementation, a method of managing a data center includes operating a plurality of data center server devices that define a particular amount of computing power, the plurality of data center server devices supported in a plurality of server racks positioned in a frame assembly that includes a plurality of bays defined along a lengthwise dimension of the frame assembly, the plurality of bays arranged in a plurality of stacked layers of bays, the plurality of stacked layers including at least a first layer of bays and a second layer of bays positioned vertically above the first layer of bays, the plurality of server racks positioned in the bays of the first layer of bays; and operating a plurality of network switches positioned in the bays of the second layer of bays, each of the network switches communicably coupled to at least one of the data center server devices in the first layer of bays.

In an aspect combinable with the general implementation, the plurality of bays are further arranged in a third layer of bays that is positioned vertically between the first and the second layers of bays.

Another aspect combinable with any of the previous aspects further includes operating an additional plurality of data center server devices that define an additional amount of computing power, the additional plurality of data center server devices mounted in an additional plurality of server racks positioned in the bays of the third layer of bays.

Another aspect combinable with any of the previous aspects further includes operating at least one cooling unit sized for a bay of the plurality of bays of the frame assembly to circulate a heated airflow from an open back side of a particular server rack, cool the heated air, and circulate a cooling airflow through an open front side of the particular server rack.

In another aspect combinable with any of the previous aspects, each bay includes a volume defined at least in part by a specified height that is orthogonal to the lengthwise dimension and a specified width that is parallel to the lengthwise dimension and sized to at least partially enclose at least one server rack, and the specified width and the specified height of the bay are based on a form factor of at least one server rack.

In another aspect combinable with any of the previous aspects, at least one of the plurality of server racks includes two server racks, each of the two server racks providing between 5 kW and 100 kW of computing power.

Another aspect combinable with any of the previous aspects further includes deploying the frame assembly into a human-occupiable space of a data center building.

Another aspect combinable with any of the previous aspects further includes arranging a first portion of the frame assembly that defines the first layer of bays onto a data center floor of the data center building.

Another aspect combinable with any of the previous aspects further includes arranging a third portion of the frame assembly that defines the third layer of bays on top of the first portion of the frame assembly.

Another aspect combinable with any of the previous aspects further includes arranging a second portion of the frame assembly that defines the second layer of bays on top of the third portion of the frame assembly.

Another aspect combinable with any of the previous aspects further includes deploying at least one least one cooling unit into at least one bay of the plurality of bays of the frame assembly.

Another aspect combinable with any of the previous aspects further includes deploying at least the plurality and the additional plurality of server racks into the first and third layers of bays defined by the first and third portions of the frame assembly.

Another aspect combinable with any of the previous aspects further includes deploying the plurality of network switches into the second layer of bays defined by the second portion of the frame assembly.

Another aspect combinable with any of the previous aspects further includes communicably coupling the plurality of network switches with the plurality and the additional plurality of server racks.

Another aspect combinable with any of the previous aspects further includes mounting at least a part of the second portion of the frame assembly to a support surface of the data center building.

In another aspect combinable with any of the previous aspects, the support surface includes a structural steel mezzanine.

Another aspect combinable with any of the previous aspects further includes deploying, to at least one of the first or third layers of bays in the first and third portions of the frame assembly, an incremental amount of data center server devices supported in an incremental number of server racks.

Another aspect combinable with any of the previous aspects further includes based on the deploying of the incremental amount of data center server devices, deploying an incremental amount of network switches to the second layer of bays in the second portion of the frame assembly.

Another aspect combinable with any of the previous aspects further includes communicably coupling the incremental amount of network switches to the incremental amount of data center server devices.

Another aspect combinable with any of the previous aspects further includes based on the deploying of the incremental amount of data center server devices, deploying at least one additional cooling unit into at least one additional bay of the plurality of bays of the frame assembly.

Implementations according to the present disclosure may include one or more of the following features. For example, implementations according to the present disclosure may provide for a dedicated networking space that allows a more tightly packed aggregation of networking switches and a reduction total cable lengths. As another example, implementations according to the present disclosure may increase a speed and efficiency of deploying networks within a data center among and between information technology (IT) equipment (e.g., electronic devices such as servers that are primarily tasked with consumer related jobs such as Internet searches, electronic mail, cloud computing, and otherwise). In some implementations, network deployments can be sped up due to simpler and shorter cable runs between network switches and IT equipment. As another example, implementations according to the present disclosure may allow for a reduced latency of communication among IT equipment and, e.g., networks external to the data center, by connecting the IT equipment with network resources through shorter, more direct cabling runs as compared to conventional data centers. This may be especially true for high performance IT equipment. As another example, implementations according to the present disclosure may more efficiently evaluate various networking topologies without disturbing IT equipment deployments before such topologies are actually implemented. Further, power and cooling solutions for an IT equipment layer (or layers) and a network switch layer can be sized and implemented according to their availability targets, which are usually different. Moreover, resources can be fully dedicated to IT equipment instead of being de-rated due additional networking requirements. In some implementations, total networking cable path lengths can be reduced by placing aggregation networking switches closer together. In the case of fiber optic cabling, a reduction in cable length may enable the use of more economically efficient optical fiber cables and optical fiber transceivers. Further, more economically efficient transceivers, active optical cables, or both may be used due to implementations according to the present disclosure.

Implementations according to the present disclosure may include one or more of the following features. For example, installation of networking cabling between networking switches and IT equipment can be shortened and simplified and may lend itself to motorized, pulley-driven cable runs as opposed to manually installed cable runs to reduce networking deployment time. Further, such implementations may also enable the use of pre-fabricated drop-in networking cable assemblies to reduce networking deployment time. Further, implementations according to the present disclosure may provide for an independently reconfigurable networking layer without disturbing the IT layers. In addition, implementations according to the present disclosure may provide for the potential for variable power and thermal domains within the data center.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

A data center according to the present disclosure includes multiple (tens, hundreds, thousands, tens of thousands) electronic components, such as servers, processors, memory modules, network switches, and other components. The components, in some aspects, are arranged in server racks or network racks that support (e.g., physically, with electricity, with cooling) the components. For example, server racks and network racks may be arranged in rows that include two or more stacked layers of the components. In some aspects, certain components, such as information technology (IT) components (e.g., servers, data storage) are arranged in rows of one or more layers with communicably coupled networking components (e.g., switches) arranged in a layer separate from the IT component layers (e.g., vertically above).

In some aspects, the IT components may be serviced (e.g., deployed into racks, replaced, repaired, or otherwise) by one or more automated equipment. In some aspects, the automated equipment may be human-operated or human-controlled (e.g., moved around the data center to service the components). In some aspects, the automated equipment may be computer-controlled (e.g., by specified software instructions) to move around the data center to service the components. In some aspects, the automated equipment may be computer-controlled according to artificial intelligence (AI) principles in order to move around the data center to service the components.

Figure 1:
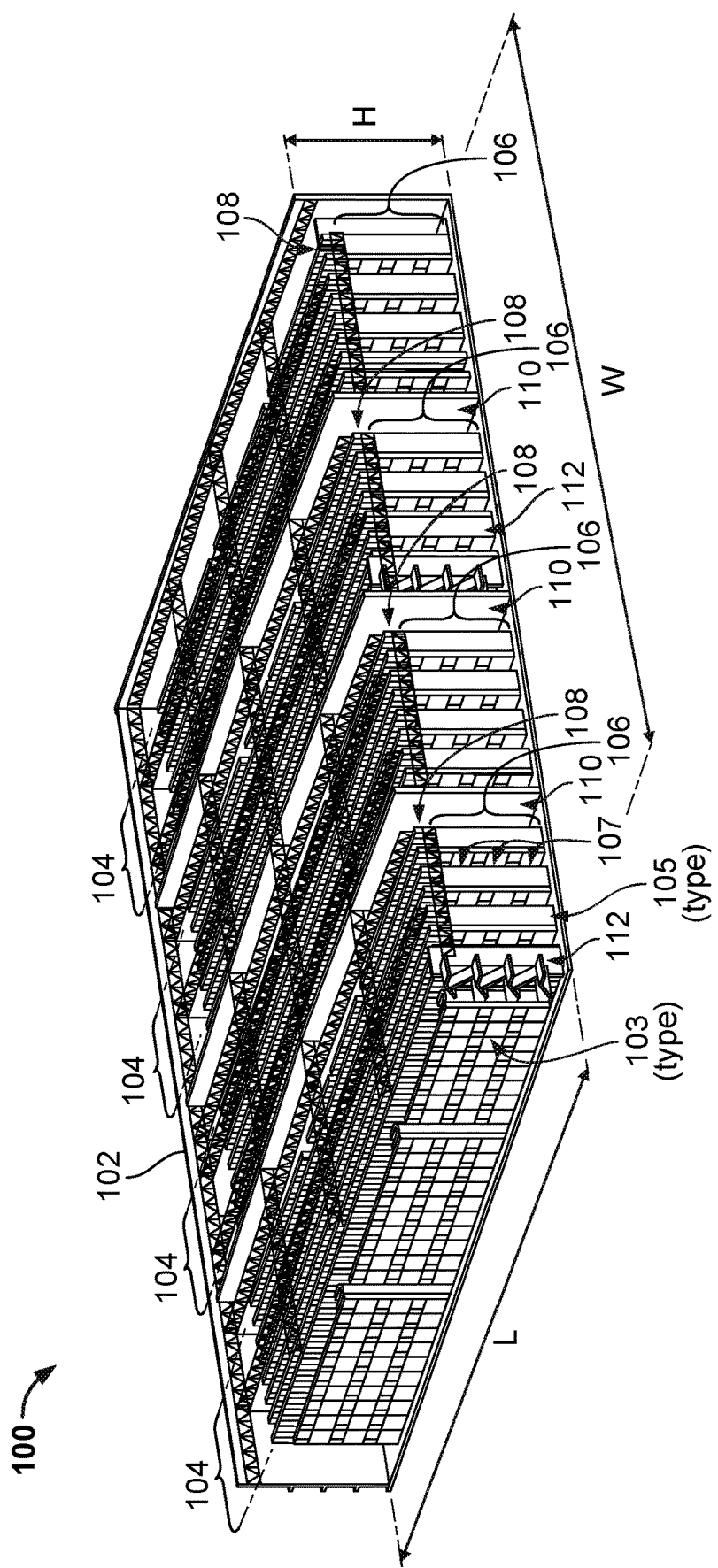
FIG. 1 is an isometric illustration of a data center that includes stacked rows of IT equipment according to the present disclosure.

FIG. 1 is an isometric illustration of a data center 100 that includes stacked rows of servers and networking switches. Data center 100 includes a data center shell building 102 that defines a human-occupiable workspace into which one or more (four shown here) clusters 104 of rows 105 of data center racks 103. As shown, certain clusters 104 of the rows 105 are separated by fire-rated walls 110. In this example, a particular cluster 104 includes multiple (one or more) rows 105 of data center racks 103. As shown in the implementation of data center 100, each cluster 104 includes eight rows of racks 103. The eight rows 105 of racks 103 in each cluster 104 includes four pairs of rows 105 with each pair of rows 105 being arranged as two back-to-back rows 105 of data center racks 103. As explained more fully in the present disclosure, two back-to-back rows 105 of data center racks 103 may be arranged so that a warm air aisle 112 is defined there between and positioned to receive an airflow from back sides of the two rows 105 of data center racks 103 that has been warmed by many (e.g., tens, hundreds, thousands, tens of thousands within the data center 100) of heat-generating IT computing devices supported in each rack 103. Further, pairs of rows 105 of data center racks 103 may be separated by a cold air aisle through which a cooling airflow (to cool the heat-generating IT computing devices) is circulated. Thus, in example implementations of the data center 100, back-to-back rows 105 of racks 103 are separated by warm air aisles 112 (adjacent open back sides of the data center racks 103) while pairs of rows 105 of data center racks 103 are separated by cold air aisles (adjacent open front sides of the data center racks 103).

As further illustrated in FIG. 1, each row 105 of data center racks 103 are arranged in multiple (more than one) vertical layers 107. Each layer 107 of data center racks 103 includes a horizontal row 105 of the racks 103 as determined by a lengthwise dimension (shown here as L) of the data center shell building 102. Further each layer 107 includes at least one other layer 106 of data center racks 103 positioned below or above (or both). Thus, layers 107 of the rows 105 of data center racks 103 are defined and positioned in a vertical direction (shown as H) in the shell building 102; rows 105 of the data center racks 103 are defined and position in the lengthwise dimension, L; and clusters 104 of the rows 105 of the data center racks 103 are defined and positioned along a widthwise dimension (shown as W) in the shell building 102.

In the illustrated implementation of data center 100, each of the layers 107 may include data center racks 103 that support IT equipment or network switch equipment that communicably couples (e.g., with fiber optic or other network cabling) the IT equipment (e.g., to other IT equipment, a network internal to the data center 100, or a network external to the data center 100). For example, as shown in FIG. 1, IT equipment layers 106 are arranged in three of the layers 107, including a bottom layer 107 (e.g., supported on a floor of the data center 100), a middle layer 107 (e.g., vertically mounted on the bottom layer 107), and a top layer 107 (e.g., vertically mounted on the middle layer 107). Mounted above the top layer 107 of IT equipment layers 106 is a networking layer 108 that supports network switches (e.g., stage 2 switches). In some aspects, the networking layer 108 is positioned on a mezzanine of the data center 100 (e.g., a human-occupiable structure at a height of the networking layer 108)

Thus, the data center 100 is an example implementation of a data center that includes a physically separate floor for the network aggregation switches, or stage 2 switches. The networking plane, in data center 100, is located on a separate floor (e.g., mezzanine) above (or a subfloor below) a data center floor that supports IT equipment (e.g., servers and storage machines). In some aspects, moving the networking switches to a separate area (e.g., layer 108) may eliminate many of the cable trays required in the IT equipment area (e.g., layers 106) since most of the cable trays are used to support the network links for network switches (e.g., stage 2) and above.

Data center 100 also includes (not specifically shown in FIG. 1) physical cabling that is routed between the layers 107 (e.g., among IT layers 106, between IT layers 106 and network layer 108). For example, pre-terminated fiber optic cable bundles can be routed between and among layers 107 to directly connect, e.g., a stage 1 switch to a stage 2 switch. Alternatively, patch panels can be used as termination points between IT layers 106 (e.g., that include server and storage machines and stage 1 switches) and the network layer 108 (e.g., that includes stage 2 switches) with structured fiber optic cabling arranged between the layers 106 and 108.

Data center 100 may also allow for or facilitate an optimized layout of IT equipment layers 106 and networking layer 108 even though their respective requirements are different. The networking layer 108 may enable a variety of network switch layouts that would be optimized from a network cabling perspective for different topologies (for example, bus, ring, star, tree, mesh, or hybrids). The networking layer 108 that includes support structure (e.g., racks 103) for the network switches (e.g., stage 2) can be arranged to reduce a distance between switching nodes of the network layer 108. For example, cable trays (in the network layer 108 or between the network layer 108 and IT layers 106) can be deployed on a tighter rectangular grid or in radial patterns to reduce network cable path lengths and simplify network cable routes. On the IT equipment layers 106, data center racks 103 can be arranged in rows to maximize deployment density. Further, in the networking layer 108 (e.g., a raised mezzanine or lowered sub-floor), non-traditional cable support structures or cabling planes can be used to convey networking cables on the networking layer 108 with multi-directional runs (e.g., as opposed to conventional cabling runs that may only allow bi-directional layouts of networking cables). In some aspects, pre-built, large network cabling assemblies can be dropped in and connected to data center racks 103 in the networking layer 103 that are deployed in closer proximity to each other in set patterns for faster deployment times.

By taking advantage of a vertical dimension in three-dimensional space (the interior environment of the data center 100) to arrange network switches (e.g., stage 2) and IT equipment that need to be closely interconnected, improvement in fiber optic cabling inventory for the data center 100 can be simplified and reachable positions of fiber optic cable length limitations can be maximized. For example, fiber optic cable reach (e.g., how far an operational cable may extend between two points) may become shorter as bandwidth increases, and therefore, increasing a number of reachable IT equipment rack spots may increase cable efficiency. By taking advantage of the vertical dimension, there may be increased capability to land IT equipment or groups of IT equipment in any location in a cluster without having to consider network cabling length constraints.

Additionally, a dedicated network layer 108 allows for many operational benefits throughout the life cycle of the data center 100. For instance, an increase in network deployment velocity can be expected via separation of network cabling routing paths leading to easier incremental network turn-ups, decommissions, and transformations. Further, operations can be accelerated by separation of trades and de-conflicting of areas turned-up by different disciplines. (e.g. network installers, electrical, IT equipment installers).

In particular implementations, a cooling unit that operates within the layer(s) of mixed computing/cooling equipment may use a cooling liquid (e.g., chilled water or chilled glycol from one or more chillers, condenser water or other evaporatively cooled liquid, or otherwise) from a data center building central plant. The cooling unit utilizes the cooling liquid in an air-to-liquid heat exchanger (e.g., liquid or refrigerant cooling coil) to cool a flow of heated air from multiple server racks. The cooling unit may include one or more fans that are controllably operated to circulate the heated airflow from the server racks to the cooling unit, through the air-to-liquid heat exchanger to cool the heated airflow, and from the cooling unit (as a cooling airflow) back, to the server racks.

The layer(s) of mixed computing/cooling equipment and IT equipment layer(s) may be deployed in a data center building in an incremental process. For example, an initial amount of IT power load (that generates a particular heat load) and networking equipment (that may also generate a heat load) may be determined. For an initial deployment, the IT power load may be in a single zone (e.g., row, cluster, columns, rows and columns, or combinations thereof) or in or in multiple zones (e.g., multiple rows, multiple clusters, multiple layers of rows or clusters). Likewise, the determined networking load may be in a single layer (e.g., in or on a mezzanine or sub-floor layer) or multiple layers. Based on the determined IT power load and networking equipment (and corresponding heat load), cooling capacity (e.g., per zone) may be determined, thereby determining a number of cooling units needed per zone (e.g., based on a maximum cooling capacity per cooling unit). IT equipment (e.g., server racks) and networking equipment may be deployed in the data center (e.g., within server rack frame assemblies arranged in one or more vertical layers) along with the determined number of cooling units (also within the server rack frame assemblies arranged in one or more vertical layers). For example, the cooling modules may be deployed interspersed in between server racks within the frame assembly, e.g., in particular locations (e.g., bays) to account for cooling requirements dictated by the server rack placements.

The initial deployment process described above can be iterative and repeated for technology refreshes (e.g., replacement of particular server racks with other, higher/lower power IT server racks or networking equipment) or new deployments (e.g., addition of server racks and networking equipment). In each iteration, based on the iteratively determined IT load and networking equipment (and corresponding determined heat load), a number and/or location of cooling units can be re-calculated. For example, if low powered server racks are being replaced with higher (relatively) powered server racks to increase a server rack power density of the data center or zone of the data center, the cooling capacity may be recalculated and cooling units can be added for the additional cooling power. Similarly, cooling units could be removed when server rack power density is reduced in the data center or zone of the data center. With incrementally deployed cooling units, cooling could be "as needed" and properly sized based on the deployed IT equipment in each zone (e.g., single layer row, portion of a single layer row, multi-layer row, or portion of a multi-layer row). For example, for low power density server racks, fewer cooling units may be deployed within a particular zone, while a larger number of cooling units may be needed for high power density server racks within a particular zone.

Incremental, mixed computing/cooling equipment deployment can be implemented in different data center equipment architectures. For example, although the present disclosure describes single and multi-level row-based architectures, other, non-linear architectures (e.g., single or multi-level clusters) can also be implemented according to the present disclosure. Further, although layers of mixed computing/cooling equipment architectures are shown, the cooling equipment may be extracted from the layers of computing equipment and implemented, e.g., as overhead cooling, underfloor cooling, end of row cooling, conventional CRAC cooling, or otherwise.

Figure 2A:
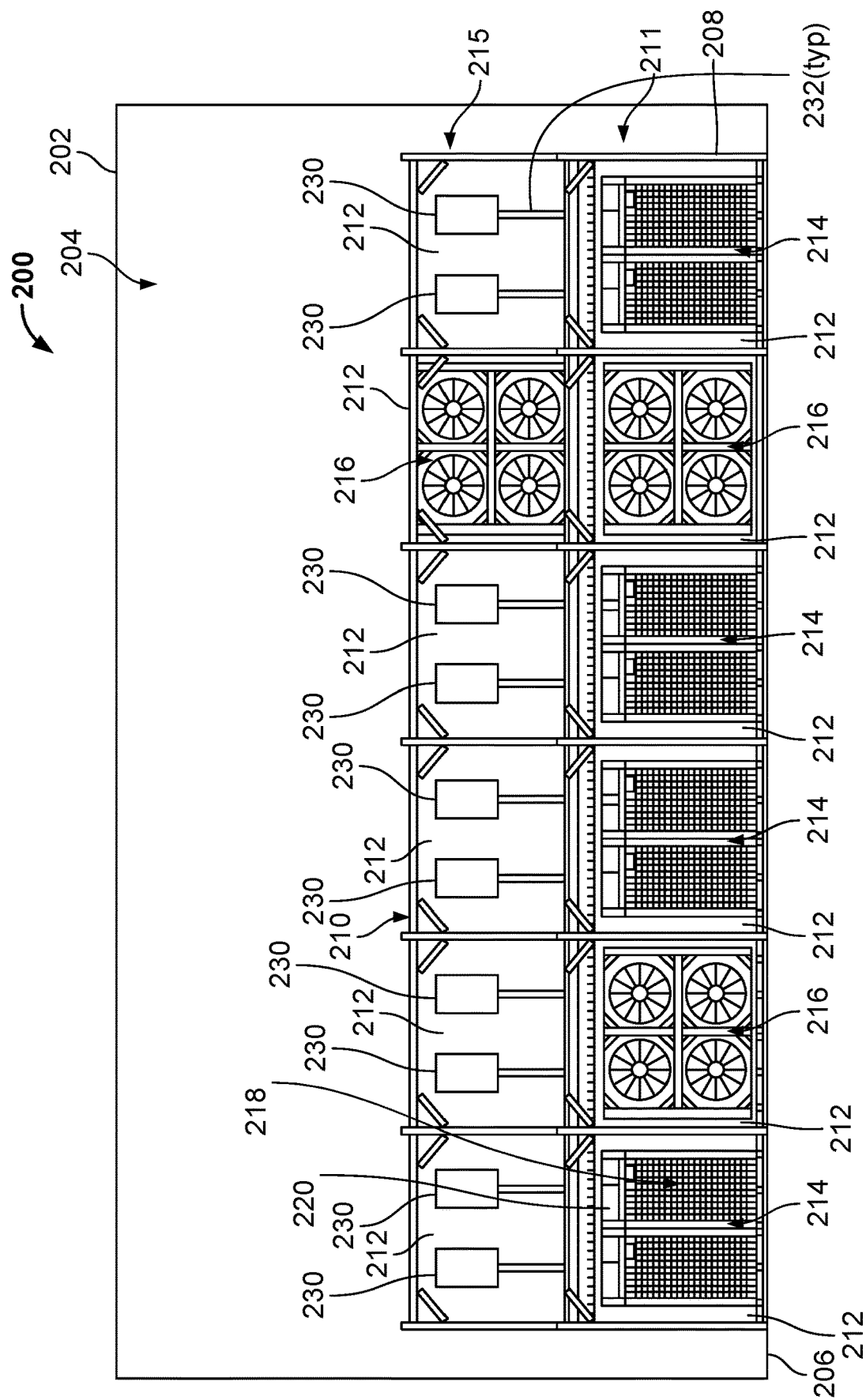
FIGS. 2A-2B are schematic illustrations of a side and end view, respectively, of an example implementation of a data center system that includes an IT equipment layer and a networking switch layer according to the present disclosure.
Figure 2B:
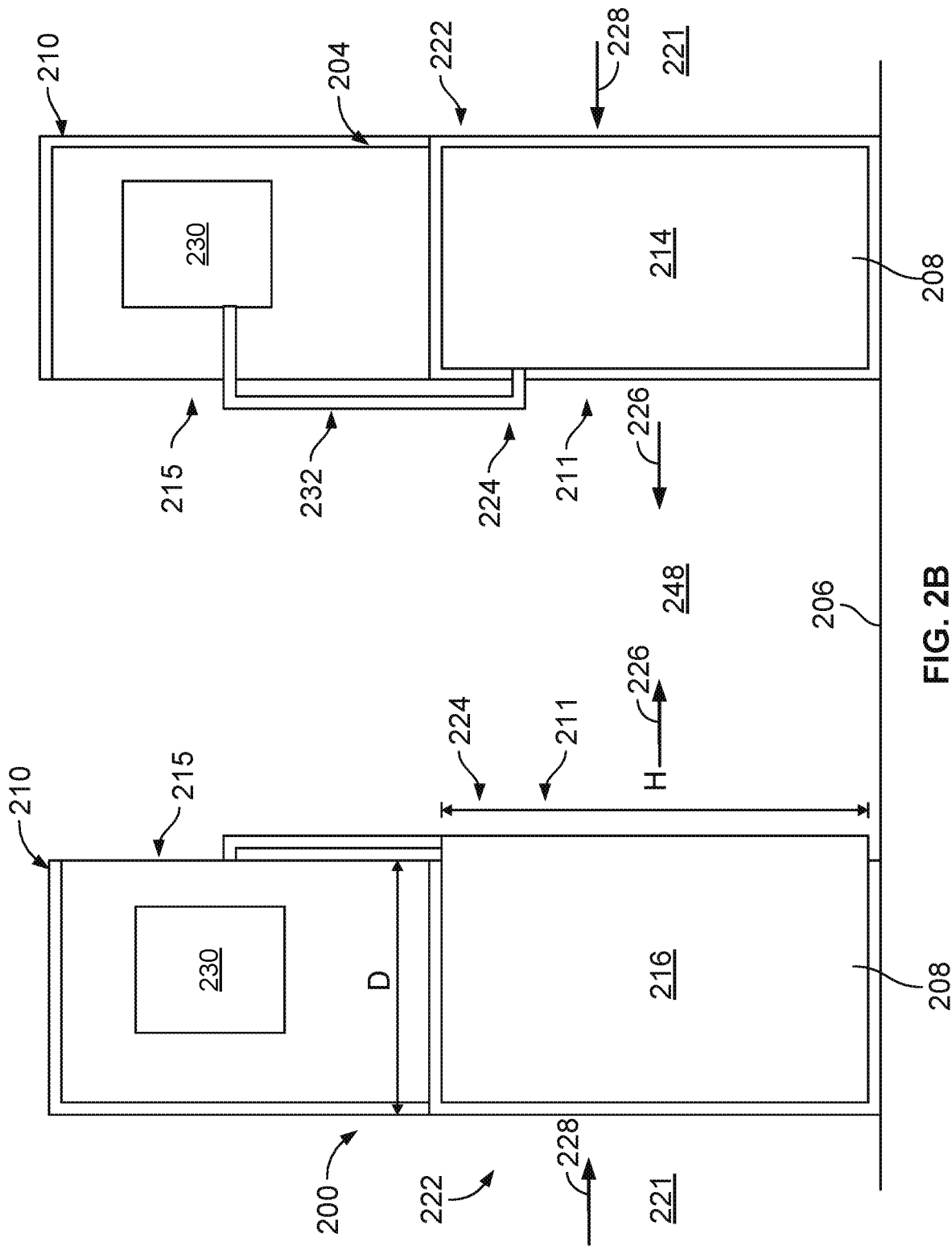

FIGS. 2A-2B are schematic illustrations of a side and end view, respectively, of an example implementation of a data center system 200 that includes a single, mixed computing and cooling layer 211 positioned in a human-occupiable workspace 204 of a data center building 202 with a networking layer 215 positioned above the computing/cooling layer 211. As shown in this example implementation, the data center system 200 includes a layer 211 of server racks 214 and cooling units 216 that are positioned in a frame assembly 210. In this example, the layer 211 is arranged in a row 208 (e.g., linear or substantially linear arrangement of the frame assembly 210). In alternative arrangements, the layers 211 and 215 may be arranged in a non-linear frame assembly, such as, for instance, a circular or partially circular frame assembly or otherwise.

As shown in FIGS. 2A-2B, the networking layer 215 is positioned on top of the computing layer 211. In this example, the networking layer 215 include network switches 230 (e.g., stage 2 switches) positioned within bays 212 of the frame assembly 210 and connected, via network cabling 232 (e.g., fiber optic or otherwise) to the IT equipment in layer 211 (e.g., one or more devices in the server racks 214). For example, in some aspects, particular network switches 230 in a particular bay 212 of layer 215 may be coupled via the network cabling 232 to server racks 214 that are located in a particular bay 212 of layer 211 that is directly below (e.g., vertically) the particular bay 212 of layer 215. In some aspects, particular network switches 230 in a particular bay 212 of layer 215 may be coupled via the network cabling 232 to server racks 214 that are located in a particular bay 212 of layer 211 that is indirectly below (e.g., vertically below and horizontally offset by one bay 212) the particular bay 212 of layer 215. Even further, in some aspects, particular network switches 230 in a particular bay 212 of layer 215 may be coupled via the network cabling 232 to server racks 214 that are located in a particular bay 212 of layer 211 that is indirectly below (e.g., vertically below and horizontally offset by more than one bay 212) the particular bay 212 of layer 215. In short, networking switches 230 may be connected via the cabling 232 to server racks 214 that are vertically below, as well as vertically below and offset.

In some aspects, networking switches 230 may be relatively large switches (e.g., several to tens of RU's (Rack Units) tall or many 1-2 RU tall switches). For example, in some aspects, the switches 230 may be network fabric racks that are made up of several line cards (with the switch chips) that plug into a large multi-RU chassis that contains a backplane that connects the line cards in a desired fashion. In other cases, such network fabric racks can be defined using many (12+) 1 RU switches connected to each other in a desired fashion. Racks that support the switches 230 may be closely coupled to build even larger configurations of switch networks. Such switch racks may also contain power conversion, batteries, or passive fiber patch panels.

As shown in FIGS. 2A-2B, the networking cabling 232, and thus the communication connections between server racks 214 (e.g., through the network switches 230), between server racks 214 and a network external to the data center 200 (e.g., through network switches 230), and between network switches 230 (e.g., through server racks 214 or from/to an external network), are largely unimpeded by, e.g., cooling infrastructure, such as cooling units 216, ductwork, piping, electrical cabling, or other cooling equipment, due to the positioning of the network switches 230 in the layer 215. By mounting the networking layer 215 vertically above the IT equipment layer 211, the Z, or vertical, dimension of the human-occupiable workspace 204 may be taken advantage of as opposed to conventional data centers. This may also provide for decreased lengths of the network cabling 232 (e.g., fiber optic or otherwise) between switches 230 and server racks 214, switches 230 and a connection at the data center 200 to an external network, and between server racks 214.

In some aspects, the example implementation of the data center 200 with separated (e.g., vertically) IT equipment layer 211 from networking layer 215 may also increase a deployment velocity of the data center equipment (e.g., server racks 214, networking switches 230) by separating networking routing paths (e.g., for the cabling 232) to enable easier incremental network turn ups, decommissions, and transformations. This may also improve accessibility for the network cabling 232. Such decoupling of the IT layer 211 and network layer 215 may also allow separate construction trades (e.g., electrical and cabling installation) to occur in parallel.

The frame assembly 210 comprises structural members (e.g., metal or non-metal, such as composite) arranged and connected to form multiple bays 212 in the frame assembly 210. Each bay 212, in this example implementation, defines a volume within the frame assembly 210 and may be the same or similar in volume and perimeter dimensions (e.g., height "H", width "W", and depth "D") as the other bays 212 in the layer 211 of the server rack assembly 210. In some aspects, H may be about 10 feet, W may be about 10 feet, and D may be about 3 feet, as an exemplary set of dimensions.

In some aspects, the perimeter dimensions of the bays 212 (and thus the volumes defined by the bays 212) in the frame assembly 210 are based on or associated with dimensions of the server racks 214. For example, in the illustrated implementations, each bay 212 is sized (e.g., at least W and H) according to dimensions of a double server rack 214 (i.e., two server racks of 42 U in height, two server racks of between 18-22 U in height, or other sized server racks). In some aspects, the server racks 214 may be 54 U in height, although frame assembly 210 may handle a variation of rack sizes. For example, the racks 214 may be about 50 inches wide each.

Furthermore, different combinations of racks 214 can be used in the example implementation. For an example, four racks 214, each 24 inches in width, can be used within the frame assembly 210. The racks 214 can also vary in depth. For example, the front faces of the server racks 214 may be flush with a front side 222 of the assembly 210, while a rear of the racks 214 may extend various depths beyond back sides 224 of the assembly 210.

As shown in FIG. 2A, the server racks 214 support electronic devices, such as processors, memory modules, networking switches, battery modules, and other server rack computing components, both physically by providing structure for the devices to be placed in and electrically by providing electric power to the devices from a main source of power (e.g., through an inverter, a transformer, or both). Generally, each illustrated server rack 214 may be one of a number of server racks within the data center building 202, which may include a server farm or a co-location facility that contains various rack mounted computer systems. Each server rack 214 may define multiple slots that are arranged in an orderly and repeating fashion within the server rack 214, and each slot is a space in the rack into which a corresponding server rack sub-assembly 218 can be placed and removed. For example, a server rack sub-assembly 218 can be supported on rails that project from opposite sides of the rack 214, and which can define the position of the slots. Also, although multiple server rack sub-assemblies 218 are illustrated as mounted within the rack 214, there might be only a single server rack sub-assembly.

The slots, and the server rack sub-assemblies 218, can be oriented with the illustrated horizontal arrangement (with respect to gravity) as shown in FIG. 2A. Alternatively, the slots, and the server rack sub-assemblies 218, can be oriented vertically (with respect to gravity). Where the slots are oriented horizontally, they may be stacked vertically in the rack 214, and where the slots are oriented vertically, they may be stacked horizontally in the rack 214.

Server rack 214, as part of a larger data center for instance, may provide data processing and storage capacity. In operation, a data center may be connected to a network, and may receive and respond to various requests from the network to retrieve, process, and/or store data. In operation, for example, the server rack 214 typically facilitates the communication of information over a network with user interfaces generated by web browser applications of users who request services provided by applications running on computers in the datacenter. For example, the server rack 214 may provide or help provide a user who is using a web browser to access web sites on the Internet or the World Wide Web.

The server rack sub-assembly 218 may be one of a variety of structures that can be mounted in a server rack 214. For example, in some implementations, the server rack sub-assembly 218 may be a "tray" or tray assembly that can be slidably inserted into the server rack 214. The term "tray" is not limited to any particular arrangement, but instead applies to motherboard or other relatively flat structures appurtenant to a motherboard for supporting the motherboard in position in a rack structure. In some implementations, the server rack sub-assembly 218 may be a server chassis, or server container (e.g., server box). In some implementations, the server rack sub-assembly 218 may be a hard drive cage.

Each server rack sub-assembly 218 can include a frame or cage, a printed circuit board, e.g., motherboard, supported on the frame, and one or more electronic devices 220, e.g., a processor or memory, mounted on the printed circuit board. The electronic devices 220 can include, for instance, processors, memories, hard drives, network switches, or other IT components. Other appurtenances, such as cooling devices, fans, uninterruptible power supplies (UPS) (e.g., battery modules), power conversion devices (e.g., from DC to DC, from DC to AC, from AC to DC) can be mounted to the server rack sub-assembly 218 (or otherwise to a rack 214).

With respect specifically to FIG. 2A, the cooling units 216 are positioned adjacent the server racks 214 in the bays 212. In some aspects, each cooling unit 216 may comprise a form factor (e.g., dimensions such as width and height) that is similar to or the same as a form factor (e.g., dimensions such as width and height) of the server racks 214. In some aspects, while a width and a height of the cooling units 216 are the same as or similar to the width and height, respectively, of the server racks 214, a depth of the cooling unit (e.g., as shown in FIG. 2B), may be different (e.g., larger) than a depth of the server racks 214. Thus, in some aspects, each cooling unit 216 may be positioned in any of the bays 212, and each server rack 214 may be positioned in any of the bays 212, thereby making the cooling units 216 and server racks 214 interchangeable within the frame assembly 210.

In some aspects, the cooling units 216 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 216 may be stand-alone refrigerant-based (DX) cooling units fluidly coupled to one or more condensing units located external to the data center building 202 (e.g., conventionally known as "CRAC" units).

As shown in more detail in FIG. 2B, a warm air aisle 248 is defined between adjacent rows 208 of server rack frame assemblies 210, with open back sides 224 of the server rack frame assemblies 210 facing the warm air aisle 248. Although only two rows 208 and one warm air aisle are shown in FIG. 2B, the data center building 202 may house multiple rows 208 with warm air aisles 248 defined between pairs of rows 208 of the server rack frame assemblies 210. In this example implementation, the open back sides 224 of the frame assemblies 210 allow for airflow with minimal or no pressure gradient between the backs of the server racks 214 (which are also open) that face the warm air aisle 248 and the warm air aisle 248 itself. Similarly, the server rack frame assemblies 210 have, in this example, open front sides 222 that face the cool air aisles 221. The open front sides 222 of the frame assemblies 210 allow for airflow with minimal or no pressure gradient between the fronts of the server racks 214 (which are also open) that face the cool air aisle 221 and the cool air aisle 221 itself. Thus, in some aspects, an air pressure at the fronts and backs of the server racks 214, which are open to the aisles 221 and 248, respectively, are substantially equal or equal to an air pressure within the aisles 221 and 248, respectively.

In operation, the cooling units 216 circulate a cooling airflow 228 through the front sides 222 of the server racks 214 (e.g., that are open to the human-occupiable workspace 204). The cooling airflow 228 receives heat from electronic devices 220 in the racks 214 and warms the airflow 228 to a heated airflow 226 that enters the warm air aisle 248. The heated airflow 226 is drawn back into the cooling units 216 (e.g., by fans in the units 216) and cooled through the one or more cooling coils (e.g., by a flow of the chilled liquid, condenser water, refrigerant, or an electrically-powered cooler such as a Peltier cooler). The cooled airflow 228 is circulated (e.g., by the fans) back into the human-occupiable workspace 204 adjacent the front sides 222 of the server racks 214 and server rack frame assemblies 210.

Figure 3A:
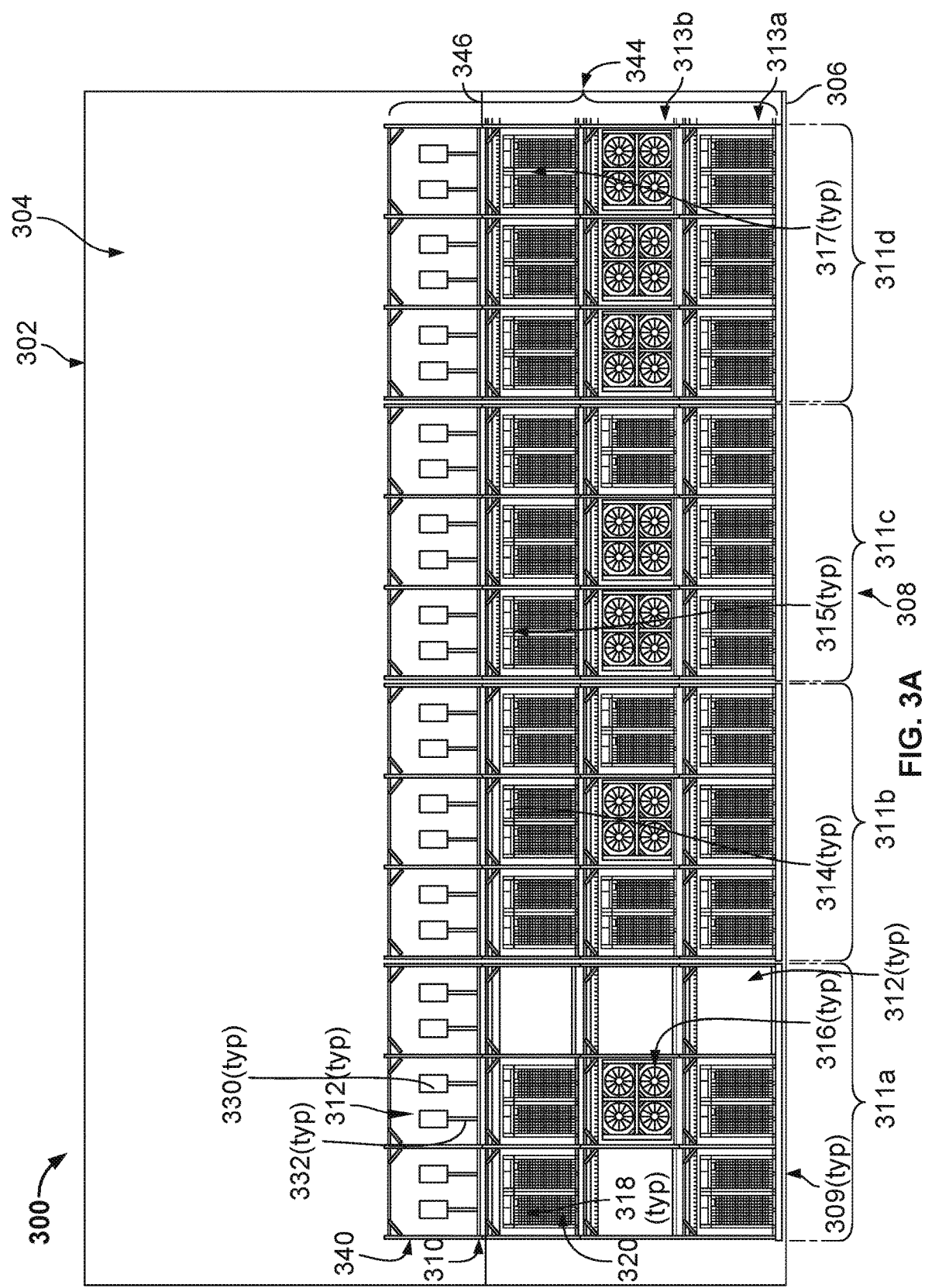
FIGS. 3A-3B are schematic illustrations of a side and end view, respectively, of another example implementation of a data center system that includes multiple IT equipment layers and a networking switch layer according to the present disclosure.
Figure 3B:
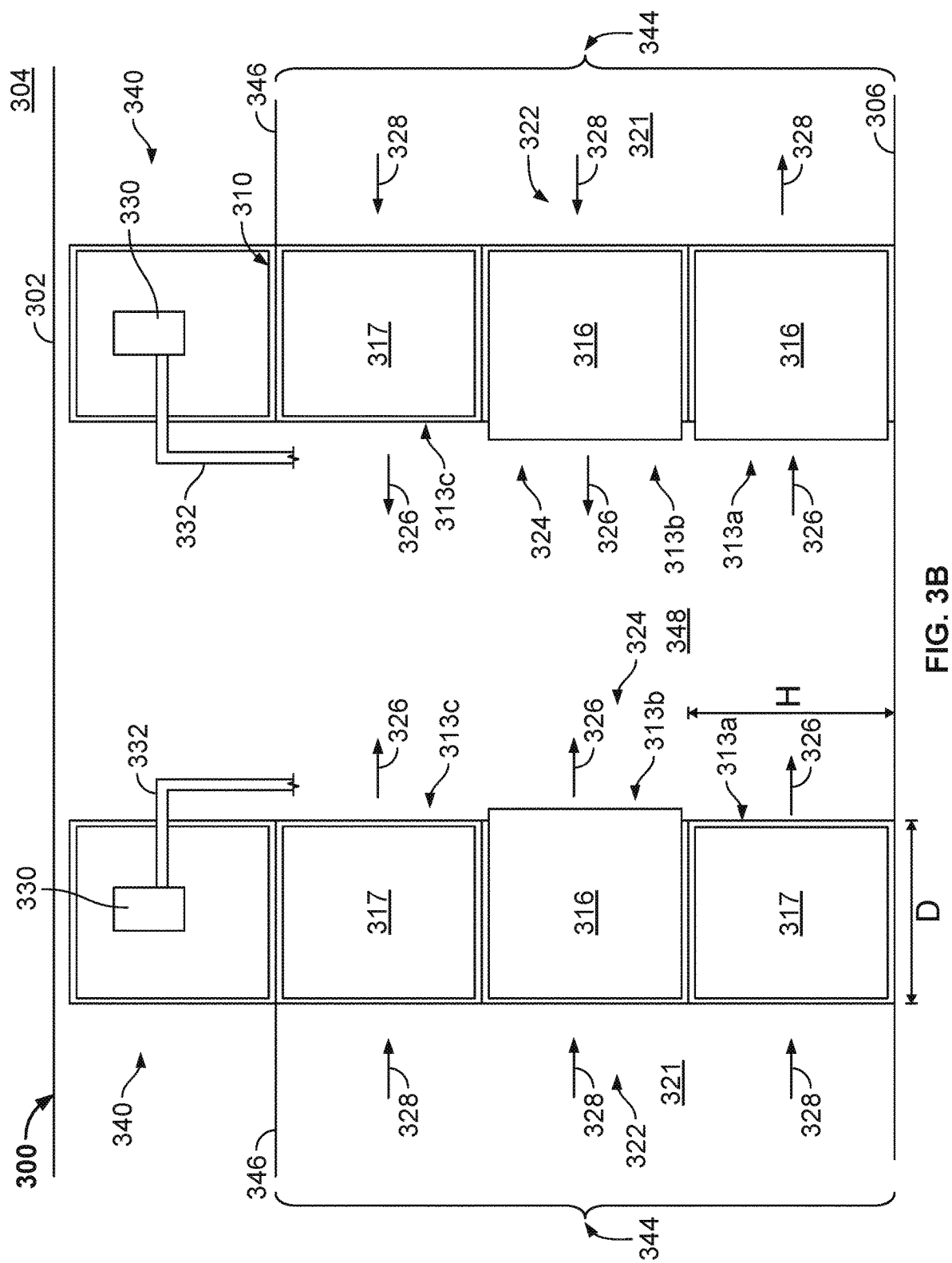

FIGS. 3A-3B are schematic illustrations of a side and end view, respectively, of another example implementation of a data center system 300 that includes multiple, stacked and mixed computing and cooling layers 313a-313c (collectively, an IT layer 344), positioned below a networking layer 340, positioned in a human-occupiable workspace 304 of a data center building 302. As shown in this example implementation, the data center system 300 includes three layers 313a-313c of server racks 314 (or server racks 315 or server racks 317) and cooling units 316, as well as networking switches 330 positioned in the networking layer 340. The server racks 314 (and 315 and 317) and network switches 330 are positioned in a frame assembly 310. In this example, the layers 313a-313c and networking layer 340 are arranged in a row 308 (e.g., linear or substantially linear arrangement of the frame assembly 310). In alternative arrangements, the layers 313a-313c and networking layer 340 may be arranged in a non-linear frame assembly, such as, for instance, a circular or partially circular frame assembly or otherwise. Although three layers 313a-313c are shown in this example, fewer (e.g., two) or more layers may be implemented without departing from the scope of the present disclosure. Regardless of the number of server rack, or IT equipment, layers 313a-313c, in some aspects, a single networking layer 340 may be positioned in the frame assembly 310 above the IT layers 344.

As shown in FIGS. 3A-3B, the networking layer 340 is positioned on top of the IT computing layers 313a-313c (and specifically, 313c). In this example implementation, the networking layer 340 may be positioned on or include a support surface 346 that is positioned between the top computing layer 313c and the networking layer 340. The support surface 346, in some aspects, may be a raised support surface, such as a mezzanine (e.g., with grated walking surfaces) from which a human operator may traverse and, e.g., service the networking switches 330 or the illustrated networking cabling 332. In some aspects, the mezzanine may be further supported by a data center floor 306 (e.g., slab, raised floor, or other surface) and/or one or more walls of the data center building 302. Thus, in some aspects, the support surface 346 may be a human-occupiable and traversable surface that is supported by, but not considered a part of, the data center building 302.

In alternative aspects, the support surface 346 may be part of or comprise a floor of the data center building 302 (e.g., a second floor, third floor, or otherwise). For example, the support surface 346 may be or include a cement slab that can support, e.g., the networking layer 340, and one or more humans or machines that may service the networking switches 330.

In this example, the networking layer 340 include network switches 330 (e.g., stage 2 switches) positioned within bays 312 of the frame assembly 310 and connected, via network cabling 332 (e.g., fiber optic or otherwise) to the server racks 314 (and 315 and 317) in IT layers 344 (e.g., one or more devices in the server racks). For example, in some aspects, particular network switches 330 in a particular bay 312 of layer 340 may be coupled via the network cabling 332 to server racks 314 (or 315 or 317) that are located in a particular bay 312 of IT layer 344 that is directly below (e.g., vertically) the particular bay 312 of layer 340. In some aspects, particular network switches 330 in a particular bay 312 of layer 340 may be coupled via the network cabling 332 to server racks 314 (or 315 or 317) that are located in a particular bay 312 of IT layer 344 that is indirectly below (e.g., vertically below and horizontally offset by one bay 312) the particular bay 312 of IT layer 340. Even further, in some aspects, particular network switches 330 in a particular bay 312 of IT layer 344 may be coupled via the network cabling 332 to server racks 314 (or 315 or 317) that are located in a particular bay 312 of IT layer 344 that is indirectly below (e.g., vertically below and horizontally offset by more than one bay 312) the particular bay 312 of layer 340. In short, networking switches 330 may be connected via the cabling 332 to server racks 314 (and 315 and 317) that are vertically below, as well as vertically below and offset.

As shown in FIGS. 3A-3B, the networking cabling 332, and thus the communication connections between server racks 314, 315, and 317 (e.g., through the network switches 330), between server racks 314 (and 315 and 317) and a network external to the data center 300 (e.g., through network switches 330), and between network switches 330 (e.g., through server racks 314, 315, 317, or from/to an external network), are largely unimpeded by, e.g., cooling infrastructure, such as cooling units 316, ductwork, piping, electrical cabling, or other cooling equipment, due to the positioning of the network switches 330 in the layer 340. By mounting the networking layer 340 vertically above (or, possibly, vertically below in a sub-floor, basement, or other level below the data center floor 306) the IT equipment layers 313a-313c, the Z, or vertical, dimension of the human-occupiable workspace 304 may be taken advantage of as opposed to conventional data centers. This may also provide for decreased lengths of the network cabling 332 (e.g., fiber optic or otherwise) between switches 330 and server racks 314 (and 315 and 317), switches 330 and a connection at the data center 300 to an external network, and between server racks 314 (and 315 and 317).

In some aspects, the example implementation of the data center 300 with separated (e.g., vertically) IT equipment layer 344 from networking layer 340 may also increase a deployment velocity of the data center equipment (e.g., server racks 314, 315, and 317, networking switches 330) by separating networking routing paths (e.g., for the cabling 332) to enable easier incremental network turn ups, decommissions, and transformations. This may also improve accessibility for the network cabling 332. Such decoupling of the IT layer 344 and network layer 340 may also allow separate construction trades (e.g., electrical and cabling installation) to occur in parallel.

The frame assembly 310 comprises structural members (e.g., metal or non-metal, such as composite) arranged and connected to form multiple bays 312 in the frame assembly 310. Each bay 312, in this example implementation, defines a volume within the frame assembly 310 and may be the same or similar in volume and perimeter dimensions (e.g., height "H" of 10 feet, width "W" of 10 feet, and depth "D" of 3 feet) as the other bays 312 in the layer 313 of the frame assembly 310. In some aspects, the perimeter dimensions of the bays 312 (and thus the volumes defined by the bays 312) in the frame assembly 310 are based on or associated with dimensions of the server racks 314 (or 315 or 317). For example, in the illustrated implementations, each bay 312 is sized (e.g., at least 10' W and 10' H) according to dimensions of a double server rack 314 (or 315 or 317) (i.e., two server racks of 42 U in height, two server racks of between 18-22 U in height, or other sized server racks). In some aspects, the server racks 314 (or 315 or 317) may be 54 U in height, although frame assembly 310 may handle a variation of rack sizes. For example, the racks 314 (or 315 or 317) may be about 50 inches wide each.

Furthermore, different combinations of racks 314 (or 315 or 317) can be used in the example implementation. For an example, four racks 314 (or 315 or 317), each 24 inches in width, can be used within the frame assembly 310. The racks 314 (or 315 or 317) can also vary in depth. For example, the front faces of the server racks 314 (or 315 or 317) may be flush with a front sides of the assembly 310, while a rear of the racks 314 (or 315 or 317) may extend various depths beyond back sides of the assembly 310.

As shown in FIG. 3A, groups of bays 312 may be arranged to form columns 309 (e.g., a vertical group of three stacked bays 312). The bays 312 may be further grouped, in this example, in clusters 311a-311d of bays 312 that include a multi-dimensional (e.g., vertical and horizontal) grouping of bays 312. In this example implementation, clusters 311a-311d are shown as three by three (e.g., three columns 309 of bays 312 by three layers 313 of bays 312) groupings of nine total bays 312. In some aspects, a column 309 or cluster 311 of bays 312 may be part of a power, cooling liquid, or network sharing architecture. For example, in some aspects, separate electrical power conductors may provide electrical power to the server racks 314 (or 315 or 317) and cooling units 316 that are positioned in separate columns 309 or clusters 311 of bays 312, e.g., to ensure that a failure of one power conductor only affects the racks 314 (or 315 or 317) and/or cooling units 316 in that particular column 309 or cluster 311. Likewise, in some aspects, separate cooling liquid conduits may provide a cooling liquid to the cooling units 316 that are positioned in separate columns 309 or clusters 311 of bays 312, e.g., to ensure that a failure of one cooling liquid conduit only affects the cooling units 316 in that particular column 309 or cluster 311. Further, in some aspects, separate networking connectors may provide data communication to the server racks 314 (or 315 or 317) that are positioned in separate columns 309 or clusters 311 of bays 312, e.g., to ensure that a failure of one network connector only affects the racks 314 (or 315 or 317) in that particular column 309 or cluster 311.

As shown in FIG. 3A, the server racks 314 (or 315 or 317) support electronic devices, such as processors, memory modules, networking switches, battery modules, and other server rack computing components, both physically by providing structure for the devices to be placed in and electrically by providing electric power to the devices from a main source of power (e.g., through an inverter, a transformer, or both). Generally, each illustrated server rack 314 (or 315 or 317) may be one of a number of server racks within the data center building 302, which may include a server farm or a co-location facility that contains various rack mounted computer systems. Each server rack 314 (or 315 or 317) may define multiple slots that are arranged in an orderly and repeating fashion within the server rack 314 (or 315 or 317), and each slot is a space in the rack into which a corresponding server rack sub-assembly 318 can be placed and removed. For example, a server rack sub-assembly 318 can be supported on rails that project from opposite sides of the rack 314 (or 315 or 317), and which can define the position of the slots. Also, although multiple server rack sub-assemblies 318 are illustrated as mounted within the rack 314 (or 315 or 317), there might be only a single server rack sub-assembly.

The slots, and the server rack sub-assemblies 314, can be oriented with the illustrated horizontal arrangement (with respect to gravity) as shown in FIG. 3A. Alternatively, the slots, and the server rack sub-assemblies 318, can be oriented vertically (with respect to gravity). Where the slots are oriented horizontally, they may be stacked vertically in the rack 314 (or 315 or 317), and where the slots are oriented vertically, they may be stacked horizontally in the rack 314 (or 315 or 317).

Server rack 314 (or 315 or 317), as part of a larger data center for instance, may provide data processing and storage capacity. In operation, a data center may be connected to a network, and may receive and respond to various requests from the network to retrieve, process, and/or store data. In operation, for example, the server rack 314 (or 315 or 317) typically facilitates the communication of information over a network with user interfaces generated by web browser applications of users who request services provided by applications running on computers in the datacenter. For example, the server rack 314 (or 315 or 317) may provide or help provide a user who is using a web browser to access web sites on the Internet or the World Wide Web.

The server rack sub-assembly 318 may be one of a variety of structures that can be mounted in a server rack 314 (or 315 or 317). For example, in some implementations, the server rack sub-assembly 318 may be a "tray" or tray assembly that can be slidably inserted into the server rack 314 (or 315 or 317). The term "tray" is not limited to any particular arrangement, but instead applies to motherboard or other relatively flat structures appurtenant to a motherboard for supporting the motherboard in position in a rack structure. In some implementations, the server rack sub-assembly 318 may be a server chassis, or server container (e.g., server box). In some implementations, the server rack sub-assembly 318 may be a hard drive cage.

Each server rack sub-assembly 318 can include a frame or cage, a printed circuit board, e.g., motherboard, supported on the frame, and one or more electronic devices 320, e.g., a processor or memory, mounted on the printed circuit board. The electronic devices 320 can include, for instance, processors, memories, hard drives, network switches, or other IT components. Other appurtenances, such as cooling devices, fans, uninterruptible power supplies (UPS) (e.g., battery modules), power conversion devices (e.g., from DC to DC, from DC to AC, from AC to DC) can be mounted to the server rack sub-assembly 318 (or otherwise to a rack 314 (or 315 or 317)).

Server racks 314, server racks 315, and server racks 317, as shown, may be physically similar or identical (e.g., similar or identical height, width, depth, weight), but may provide different computing power and, thus, different heat output. For example, server racks 314 may be 15 kW racks, with electronic devices 320 that generate about 15 kW of heat each. Server racks 315 may be 30 kW racks, with electronic devices 320 that generate about 30 kW of heat each. Server racks 317 may be 100 kW racks, with electronic devices 320 that generate about 100 kW of heat each. Thus, in some aspects, a number and computing power of the particular racks (e.g., server racks 314, 315, and/or 317) within a particular layer 313a-313c, a particular column 309, or a particular cluster 311a-311d of bays 312 may dictate a number of cooling units 316 that are positioned within the particular layer 313a-313c, particular column 309, or particular cluster 311a-311d of bays 312. For example, the greater number of server racks 317 relative to server racks 314 within any particular layer, column, or cluster may dictate (e.g., due to cooling requirements for the heat generated by the electronic devices 320 in the racks) a greater number of cooling units 316 within the particular layer, column, or cluster. Conversely, the greater number of server racks 314 relative to server racks 317 within any particular layer, column, or cluster may dictate (e.g., due to cooling requirements for the heat generated by the electronic devices 320 in the racks) a fewer number of cooling units 316 within the particular layer, column, or cluster.

In some aspects, each particular layer, column, or cluster (or other sub-unit of the frame assembly 310) may be reconfigured over an operating lifetime of the data center system 300. For example, reconfiguration may include moving particular server racks 314 (or 315 or 317) from particular bays 312 to other bays 312. In such reconfigurations, a number of cooling units 316 may not change, but such cooling units 312 may also be moved from particular bays 312 to other bays 312 (e.g., to account for movement of heat sources from one location to another location). Reconfigurations may also include replacing server racks 314 with higher power server racks 315 or 317 within particular bays 312. In such reconfigurations, a number of cooling units 316 may increase (e.g., to account for additional heat generated by the higher power racks 315 or 317) within a particular layer, column, or cluster. Reconfigurations may also include replacing server racks 317 with lower power server racks 315 or 314 within particular bays 312. In such reconfigurations, a number of cooling units 316 may decrease (e.g., to account for less heat generated by the lower power racks 315 or 314) within a particular layer, column, or cluster. Reconfigurations may also include removing server racks 314 (or 315 or 317) from particular bays 312. In such reconfigurations, a number of cooling units 316 may decrease (e.g., to account for less heat generated) within a particular layer, column, or cluster. In such reconfigurations, for example, when a particular bay 312 does not include any server rack 314 (or 315 or 317) or cooling unit 316, a blank-off panel (e.g., sheet metal or otherwise) may be installed across a width and height of the bay 312 to prevent airflow from being circulated through the empty bay 312.

While FIG. 3A shows the clusters 311a-311d within a single row 308 of the frame assembly 310, each cluster 311 may represent a particular configuration at a particular operating time of the data center system 300 for illustrative purposes. For example, cluster 311a may represent a configuration at an initial operating time of the system 300, with only four server racks 314 and one cooling unit 316 within the nine total bays 312 of the cluster 311a. At the initial operating time, only a single cooling unit 316 may be needed to remove the heat generated by the four server racks 314. Empty bays 312 may include blank-off panels as previously described.

Cluster 311b may represent a configuration at a later operating time of the system 300, with eight server racks 314 and one cooling unit 316 within the nine total bays 312 of the cluster 311b. At the later operating time, still only a single cooling unit 316 may be needed to remove the heat generated by the eight server racks 314. In this configuration, no bays 312 are empty.

Cluster 311c may represent a configuration at another later operating time of the system 300, with seven server racks 315 and two cooling units 316 within the nine total bays 312 of the cluster 311c. At this later operating time, two single cooling units 316 may be needed to remove the heat generated by the seven server racks 315, which, as described, may have more computing power and thus generate more heat than the server racks 314, and thus require additional cooling power (through the additional cooling units 316) to remove the generated heat.

Cluster 311d may represent a configuration at still another later operating time of the system 300, with six server racks 317 and three cooling units 316 within the nine total bays 312 of the cluster 311d. At this later operating time, three single cooling units 316 may be needed to remove the heat generated by the six server racks 317, which, as described, may have more computing power and thus generate more heat than the server racks 314 and 315, and thus require additional cooling power (through the additional cooling units 316) to remove the generated heat.

With respect specifically to FIG. 3A, the cooling units 316 are positioned adjacent the server racks 314 (or 315 or 317) in the bays 312. In some aspects, each cooling unit 316 may comprise a form factor (e.g., dimensions such as width and height) that is similar to or the same as a form factor (e.g., dimensions such as width and height) of the server racks 314 (or 315 or 317). In some aspects, while a width and a height of the cooling units 316 are the same as or similar to the width and height, respectively, of the server racks 314 (or 315 or 317), a depth of the cooling unit (e.g., as shown in FIG. 3B), may be different (e.g., larger) than a depth of the server racks 314 (or 315 or 317). Thus, in some aspects, each cooling unit 316 may be positioned in any of the bays 312, and each server rack 314 (or 315 or 317) may be positioned in any of the bays 312, thereby making the cooling units 316 and server racks 314 (or 315 or 317) interchangeable within the frame assembly 310.

In some aspects, the cooling units 316 may be fluidly coupled to a source of the cooling liquid, such as a chiller plant, one or more evaporative cooling units (e.g., cooling towers), one or more condensing units (e.g., in the case of direct expansion cooling), a natural source of cooling liquid (e.g., lake, ocean, river, or other natural body of water), or a combination thereof. In some aspects, the cooling units 316 may be stand-alone refrigerant-based (DX) cooling units fluidly coupled to one or more condensing units located external to the data center building 302 (e.g., conventionally known as "CRAC" units.

As shown in more detail in FIG. 3B, a warm air aisle 348 is defined between adjacent rows 308 of server rack frame assemblies 310, with open back sides 324 of the server rack frame assemblies 310 facing the warm air aisle 348. Although only two rows 308 and one warm air aisle are shown in FIG. 3B, the data center building 302 may house multiple rows 308 with warm air aisles 348 defined between pairs of rows 308 of the server rack frame assemblies 310. In this example implementation, the open back sides 324 of the frame assemblies 310 allow for airflow with minimal or no pressure gradient between the backs of the server racks 314 (or 315 or 317) (which are also open) that face the warm air aisle 348 and the warm air aisle 348 itself. Similarly, the server rack frame assemblies 310 have, in this example, open front sides 322 that face the cool air aisles 321. The open front sides 322 of the frame assemblies 310 allow for airflow with minimal or no pressure gradient between the fronts of the server racks 314 (or 315 or 317) (which are also open) that face the cool air aisle 321 and the cool air aisle 321 itself. Thus, in some aspects, an air pressure at the fronts and backs of the server racks 314 (or 315 or 317), which are open to the aisles 321 and 348, respectively, are substantially equal or equal to an air pressure within the aisles 321 and 348, respectively.

In operation, the cooling units 316 circulate a cooling airflow 328 through the front sides 322 of the server racks 314 (or 315 or 317) (e.g., that are open to the human-occupiable workspace 304. The cooling airflow 328 receives heat from electronic devices 320 in the racks 314 (or 315 or 317) and warms the airflow 328 to a heated airflow 326 that enters the warm air aisle 348. The heated airflow 326 is drawn back into the cooling units 316 (e.g., by fans in the units 316) and cooled through the one or more cooling coils (e.g., by a flow of the chilled liquid, condenser water, refrigerant, or an electrically-powered cooler such as a Peltier cooler). The cooled airflow 328 is circulated (e.g., by the fans) back into the human-occupiable workspace 304 adjacent the front sides 322 of the server racks 314 (or 315 or 317) and server rack frame assemblies 310.

Figure 4A:
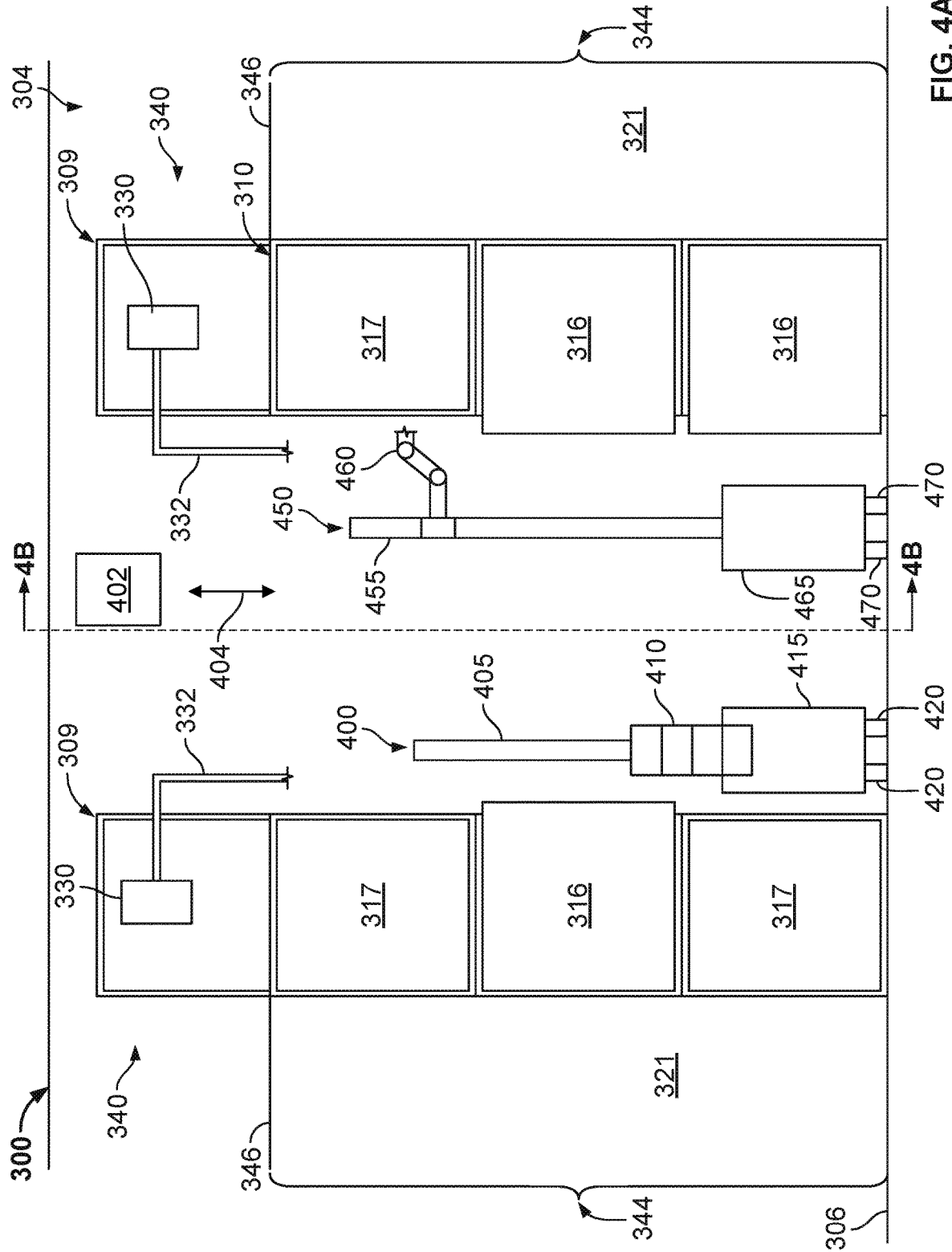
FIGS. 4A-4B are schematic illustrations of a side and back view, respectively, of an example implementation of a data center system that includes an automatic servicing machine according to the present disclosure.
Figure 4B:
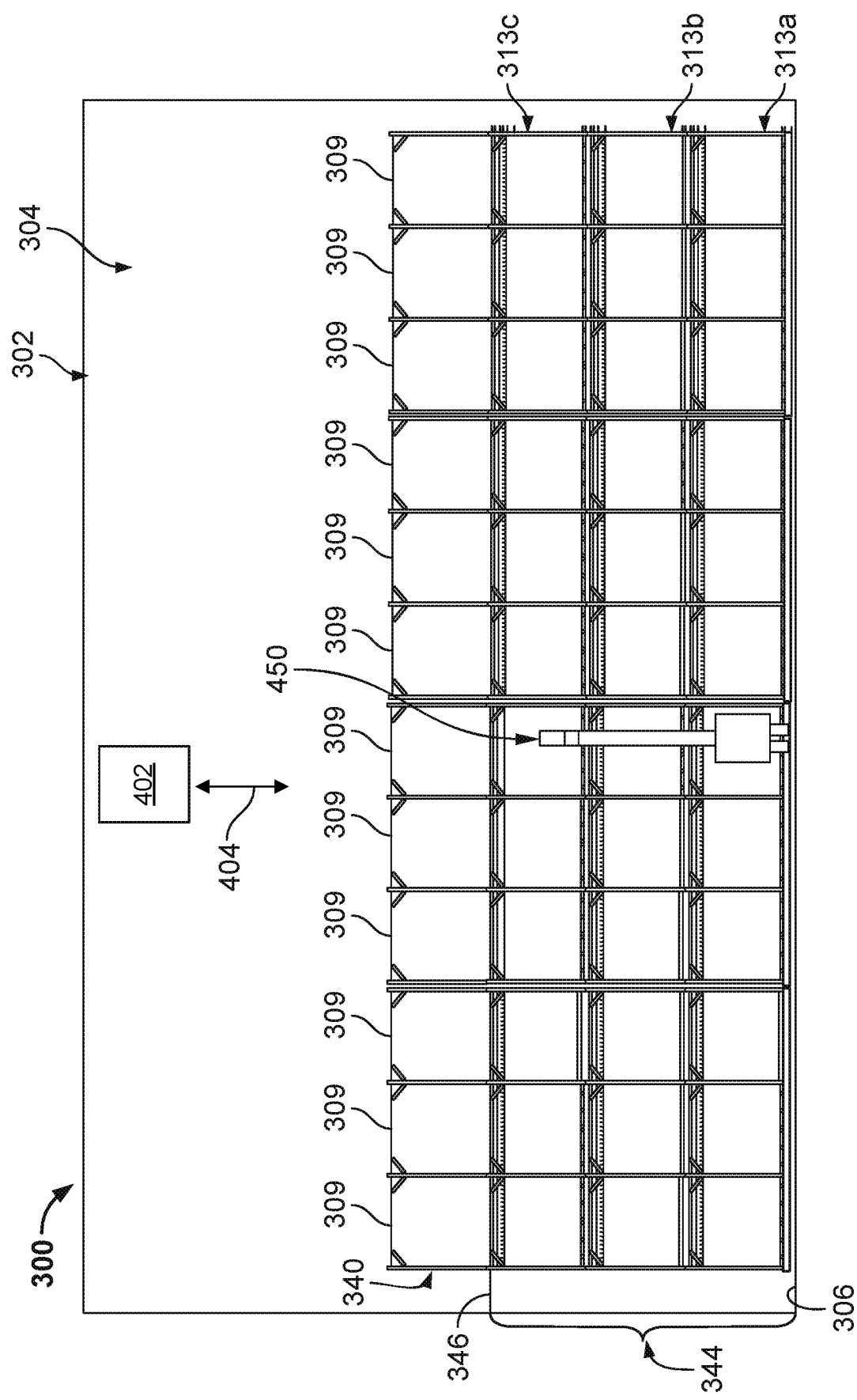

FIGS. 4A-4B are schematic illustrations of a side and back view, respectively, of an example implementation of a data center system, e.g., for data center 300, that includes one or more automatic servicing machines, such as the illustrated automated service machines 400 and 450. Generally, each of the automated service machines 400 and 450 may be operated, controlled, programmed, or pre-programmed to perform one or more tasks related to deployment, servicing, or replacement of IT equipment, such as server rack-sub-assemblies 318 or electronic devices 320 or networking equipment, such as networking switches 330. Although the automated service machines 400 and 450 are illustrated in the context of the data center 300, such machines 400 and 450 according to the present disclosure may also be utilized, e.g., in data center 100, data center 200, or another data center according to the present disclosure (e.g., a data center with a layered, stacked structure of IT equipment and networking equipment).

The illustrated example includes an automated service machine 400 and an automated service machine 450 within the data center 300. Generally, automated service machine 400 represents a human-operated (e.g., human on-board) automated service machine (e.g., a lift truck, forklift, or otherwise), and includes a motor 415 (e.g., electric, propane, gasoline, or otherwise) mounted on rollers 420 (e.g., wheels, sliders, rail wheels). The automated service machine 400 also includes a support basket 410 in which a human-operator may ride while, for example, operating the automated service machine 400. A mast 405 is mounted to the motor 415 and provides a height-adjustment mechanism for the basket 410 (which may vertically move up and down the mast 405 to adjust the height of the basket 410 relative to the data center floor 306). Although the rollers 420 are shown as contacting the data center floor 306, in alternative implementations, the rollers 420 may engage one or more tracks (or slots) attached to (or formed in) the data center floor 306. In some aspects, the tracks (not shown here) may be arranged to run along one or both sides (front and/or back sides) of one or more rows of the layers 344 and 340 in the data center 300.

Generally, automated service machine 450 represents a human or computer-controlled (e.g., no human on-board) automated service machine, and includes a motor 465 (e.g., electric, propane, gasoline, or otherwise) mounted on rollers 470 (e.g., wheels, sliders, rail wheels). The automated service machine 450 also includes a mast 455 that is mounted to the motor 465 and provides a height-adjustment mechanism for an extendable end effect 460 (e.g., claw, pincher, forks, magnetized end, etc.), which may vertically move up and down the mast 455 to adjust the height of the end effect 460 relative to the data center floor 306. Although the rollers 470 are shown as contacting the data center floor 306, in alternative implementations, the rollers 470 may engage one or more tracks (or slots) attached to (or formed in) the data center floor 306. In some aspects, the tracks (not shown here) may be arranged to run along one or both sides (front and/or back sides) of one or more rows of the layers 344 and 340 in the data center 300.

In some aspects, one or both of the automated service machines 400 and 450 may at least partially be controlled by a control system 402, through one or more wireless (or wired) signals 404. The control system 402, in some aspects, may be a micro-processor based control system, such as a building automation system or otherwise. In any event, whether controlled solely by a human operator on board, such as for automated service machine 400, or with or by control system 402 (which may be on board the automated service machine 400 or 450), such as for automated service machine 450, each of the automated service machines 400 and 450 may perform one or more of the following operations.

For example, the automated service machines 400 and 450 may be moved through the data center 300 adjacent any of the bays 312 of the frame assembly 310, whether in IT layers 344 or networking layer 340. The movement of the automated service machines 400 and 450 can be between rows of the frame assemblies 310 (and layers 344 and 340) or otherwise within a human-occupiable workspace of the data center 300. In some aspects, the automated service machines 400 and 450 may be moved through the data center 300 adjacent any of the bays 312 of the frame assembly 310 based on an indication by one or more of the server rack-sub-assemblies 318, electronic devices 320 or networking switches 330, of a malfunction or need for replacement. In some aspects, the automated service machines 400 and 450 may be moved through the data center 300 adjacent any of the bays 312 of the frame assembly 310 based on a pre-determined periodic maintenance of one or more of the server rack-sub-assemblies 318, electronic devices 320 or networking switches 330.

Once the automated service machines 400 and 450 are moved into a particular place in the data center 300 (e.g., adjacent a particular bay 312 of the frame assembly 310), the automated service machines 400 and 450 may be controlled or operated to perform a deployment, servicing, or replacement function, among others. For example, if a particular component such as a server rack-sub-assembly 318, electronic device 320, or networking switch 330 needs to be deployed, serviced, or replaced, a location within the data center 300 of the component (three dimensional location, including height from the data center floor 306) may be determined (e.g., by the control system 402, a human-operator on or controlling one of the automated service machines 400 or 450, or otherwise). For example, the control system 402 may determine a particular location (e.g., in three-dimensional space) of each component in the human-occupiable workspace 304 of the data center building 302 (e.g., with a GPS receiver positioned at or near each of the server rack sub-assemblies 318 or server racks 314, a pre-determined mapping of each of the server rack sub-assemblies 318 or server racks 314 to their associated locations, or otherwise).

If, for instance, the determined three-dimensional location of the particular component (e.g., to be deployed, serviced, replaced, or otherwise) is above (e.g., in a Z, or height, direction) than is reachable by a human standing on the data center floor 306, then the automated service machines 400 and 450 may be operated or moved to raise the particular component to the appropriate height. For example, the support basket 410 of automated service machine 400 may be adjusted (e.g., vertically on the mast 405) to raise a human-operator within the basket 410 to a particular height above the data center floor 306 to, e.g., deploy, service, or replace the particular component. The end effect 460 (which may hold or otherwise be connected to the particular component) of automated service machine 450 may be adjusted (e.g., vertically on the mast 455 and/or horizontally from the mast 455) to raise the particular component supported or held by the end effect 460 to a particular height above the data center floor 306 to, e.g., deploy, service, or replace the particular component.

Other operations may be performed by the automated services machines 400 and 450. For example, the automated service machines 400 and 450 can also be used to deploy non-IT equipment as well, such as air baffles or shelving that may be needed in an area or during a reconfiguration. The machines 400 and 450 may also deploy power conversion and batteries as well. For example, the automated machines 400 and 450 can also plug in and power up a rack, as well as move and reconfigure a rack (e.g., a server rack).

Figure 5:
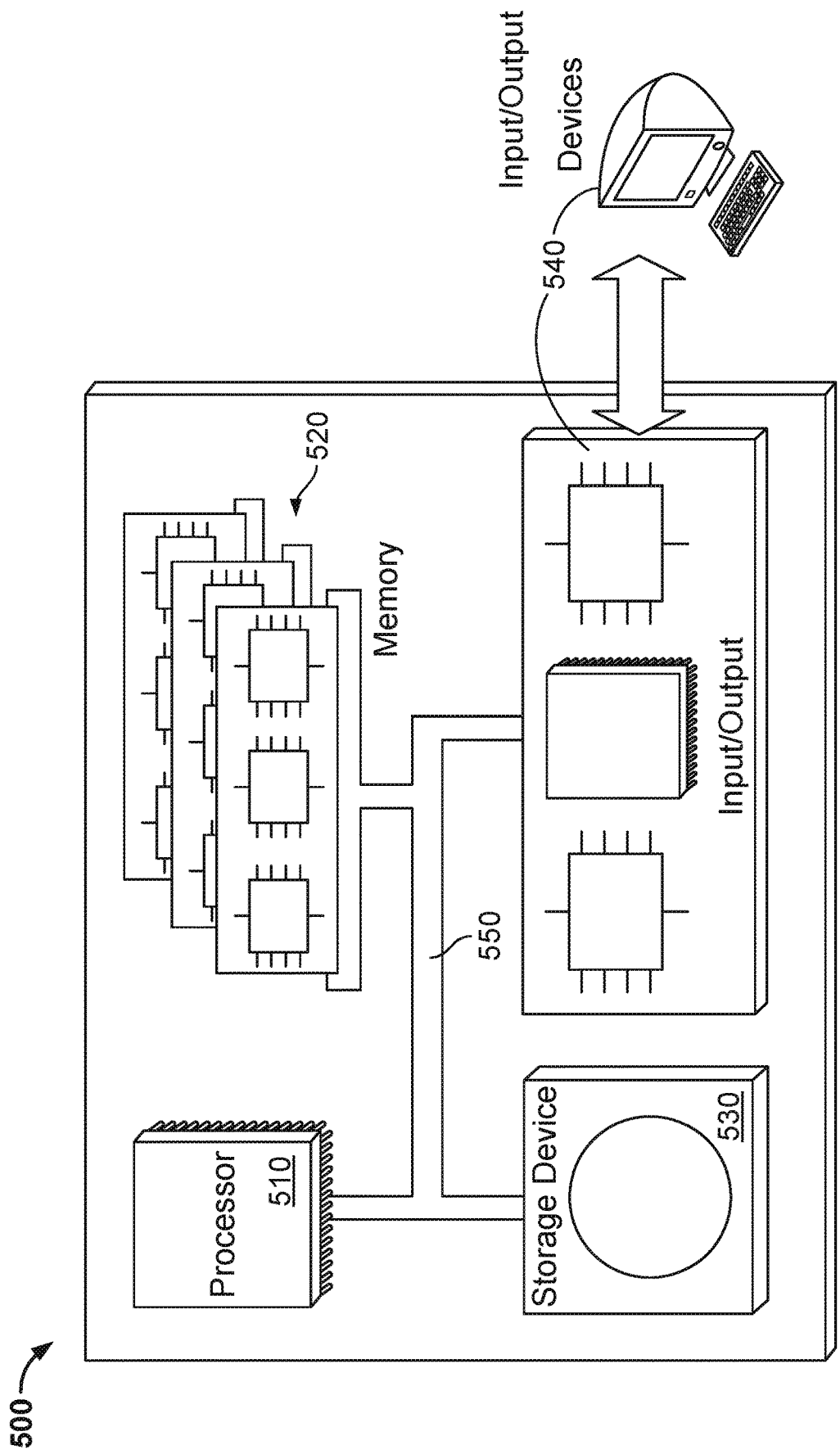
FIG. 5 is a schematic illustration of an example controller for a data center IT equipment servicing system according to the present disclosure.

FIG. 5 is a schematic illustration of an example controller 500 (or control system) for an automated service machine according to the present disclosure. For example, the controller 500 may include or be part of the control system 402 shown in FIGS. 4A-4B. The controller 500 is intended to include various forms of digital computers, such as printed circuit boards (PCB), processors, digital circuitry, or otherwise that is part of a vehicle. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 500 includes a processor 510, a memory 520, a storage device 530, and an input/output device 540. Each of the components 510, 520, 530, and 540 are interconnected using a system bus 550. The processor 510 is capable of processing instructions for execution within the controller 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the controller 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the controller 500. In one implementation, the storage device 530 is a computer-readable medium. In various different implementations, the storage device 530 may be a floppy disk device, a hard disk device, an optical disk device, or a tape device.

The input/output device 540 provides input/output operations for the controller 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touch-screen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A data center system, comprising:
a data center building that comprises a human-occupiable workspace and a floor that defines at least one boundary of the human-occupiable workspace;

a frame assembly that comprises a plurality of structural members connected to form a plurality of bays defined along a lengthwise dimension of the frame assembly, the plurality of bays arranged in an array that defines a plurality of columns of bays and a plurality of stacked layers of bays, each of the bays separated horizontally from adjacent ones of the bays within a particular layer of the plurality of stacked layers of bays by a plurality of vertical structural members of the plurality of structural members and separated vertically from adjacent ones of the bays within a particular column of bays of the plurality of columns by a plurality of horizontal structural members of the plurality of structural members, the plurality of stacked layers comprising at least a first layer of bays and a second layer of bays positioned directly on top of and vertically above the first layer of bays, the frame assembly and the stacked layers of bays of the plurality of bays positioned and enclosed within the human-occupiable workspace of the data center building and supported by the floor of the data center building, the frame assembly comprising a first open side that is directly adjacent a warm air aisle within the human-occupiable workspace and a second open side opposite the first open side that is directly adjacent a cool air aisle within the human-occupiable workspace;

a plurality of server racks positioned exclusively only in the bays of the first layer of bays, each of the server racks configured to support a plurality of data center server devices that define a particular amount of computing power; and a plurality of network switches exclusively only positioned in the bays of the second layer of bays and external of the plurality of server racks positioned in the first layer of bays, each of the network switches communicably coupled to at least one of the data center server devices in the first layer of bays, each of the plurality of network switches comprising a stage 2 aggregation switch, where the plurality of data center server devices that define the particular amount of computing power are exclusive of the plurality of network switches, and each of the plurality of bays is sized to receive at least one server rack of the plurality of server racks.

2. The data center system of claim 1, wherein the plurality of bays are further arranged in a third layer of bays that is positioned vertically below the first and the second layers of bays; and another plurality of server racks are positioned in the bays of the third layer of bays, each of the another plurality server racks is configured to support another plurality of data center server devices that define an additional amount of computing power.

3. The data center system of claim 2, wherein the frame assembly comprises:

a first portion that defines the first layer of bays;

a second portion stacked on top of the first portion, the second portion defining the second layer of bays; and a third portion below the first portion, the third portion defining the third layer of bays.

4. The data center system of claim 1, further comprising at least one cooling unit sized for a bay of the plurality of bays of the frame assembly and configured to circulate a heated airflow from the warm air aisle adjacent an open back side of a particular one of the server racks, cool the heated air, and circulate a cooling airflow through an open front side of the particular one of the server racks and to the cool air aisle.

5. The data center system of claim 4, wherein at least one perimeter dimension of the at least one cooling unit is based on a form factor of the at least one server rack.

6. The data center system of claim 1, wherein each of the plurality of bays comprises a volume defined at least in part by a specified height that is orthogonal to the lengthwise dimension, a specified width that is parallel to the lengthwise dimension and sized to enclose the at least one server rack, and a specified depth that is orthogonal to the lengthwise dimension.

7. The data center system of claim 6, wherein the specified width and the specified height of each of the bays are based on a form factor of the at least one server rack.

8. The data center system of claim 1, wherein the at least one server rack comprises at least two server racks, each of the at least two server racks providing between 5 kW and 100 kW of the computing power.

9. The data center system of claim 1, wherein at least a portion of the frame assembly that defines the bays of the second layer of bays is configured to mount on a support surface of the data center building.

10. The data center system of claim 9, wherein the support surface comprises a structural steel mezzanine.

11. The data center system of claim 1, further comprising network cabling that extends through the warm air aisle and communicably couples at least one of the plurality of network switches with the at least one of the data center server devices in the first layer of bays.

12. A method of managing a data center comprising:

operating a plurality of data center server devices that define a particular amount of computing power, the plurality of data center server devices supported in a plurality of server racks positioned in a frame assembly that comprises a plurality of structural members connected to form a plurality of bays defined along a lengthwise dimension of the frame assembly, the plurality of bays arranged in an array that defines a plurality of columns of bays and a plurality of stacked layers of bays, each of the bays separated horizontally from adjacent ones of the bays within a particular layer of the plurality of stacked layers of bays by a plurality of vertical structural members of the plurality of structural members and separated vertically from adjacent ones of the bays within a particular column of bays of the plurality of columns by a plurality of horizontal structural members of the plurality of structural members, the plurality of stacked layers comprising at least a first layer of bays and a second layer of bays positioned directly on top of and vertically above the first layer of bays, the plurality of server racks exclusively only positioned in the bays of the first layer of bays, where the frame assembly and the stacked layers of bays of the plurality of bays are positioned and enclosed within a human-occupiable workspace of a data center building and supported by a data center floor of the data center building, the frame assembly comprising a first open side that is directly adjacent a warm air aisle within the human-occupiable workspace and a second open side opposite the first open side that is directly adjacent a cool air aisle within the human-occupiable workspace; and operating a plurality of network switches that are exclusively only positioned in the bays of the second layer of bays and external of the plurality of server racks positioned in the first layer of bays, each of the network switches communicably coupled to at least one of the data center server devices in the first layer of bays, and each of the plurality of network switches comprises a stage 2 aggregation switch, where the plurality of data center server devices that define the particular amount of computing power are exclusive of the plurality of network switches, and each of the plurality of bays is sized to receive at least one server rack of the plurality of server racks.

13. The method of claim 12, wherein the plurality of bays are further arranged in a third layer of bays that is positioned vertically below the first and the second layers of bays, the method further comprising:
operating an additional plurality of data center server devices that define an additional amount of computing power, the additional plurality of data center server devices mounted in an additional plurality of server racks positioned in the bays of the third layer of bays.

14. The method of claim 13, further comprising:
deploying the frame assembly into the human-occupiable space of the data center building;
arranging a third portion of the frame assembly that defines the third layer of bays onto the data center floor of the data center building;
arranging a first portion of the frame assembly that defines the first layer of bays on top of the first portion of the frame assembly;
arranging a second portion of the frame assembly that defines the second layer of bays on top of the third first portion of the frame assembly;
deploying at least one cooling unit into at least one bay of the plurality of bays of the frame assembly;
deploying at least the plurality and the additional plurality of server racks into the first and third layers of bays defined by the first and third portions of the frame assembly;
deploying the plurality of network switches into the second layer of bays defined by the second portion of the frame assembly; and
communicably coupling the plurality of network switches with the plurality and the additional plurality of server racks.

15. The method of claim 14, further comprising mounting at least a part of the second portion of the frame assembly to a support surface of the data center building.

16. The method of claim 15, wherein the support surface comprises a structural steel mezzanine.

17. The method of claim 14, further comprising:
deploying, to at least one of the first or third layers of bays in the first and third portions of the frame assembly, an incremental amount of the data center server devices supported in an incremental number of the server racks;
based on the deploying of the incremental amount of data center server devices, deploying an incremental amount of the network switches to the second layer of bays in the second portion of the frame assembly; and
communicably coupling the incremental amount of the network switches to the incremental amount of the data center server devices.

18. The method of claim 17, further comprising, based on the deploying of the incremental amount of the data center server devices, deploying at least one additional cooling unit into at least one additional bay of the plurality of bays of the frame assembly.

19. The method of claim 12, further comprising operating at least one cooling unit sized for a bay of the plurality of bays of the frame assembly to circulate a heated airflow from the warm air aisle to an open back side of a particular one of the server racks, cool the heated air, and circulate a cooling airflow through an open front side of the particular one of the server racks to the cool air aisle.

20. The method of claim 12, wherein each of the plurality of bays comprises a volume defined at least in part by a specified height that is orthogonal to the lengthwise dimension and a specified width that is parallel to the lengthwise dimension and sized to enclose the at least one server rack, the specified width and the specified height of the bay are based on a form factor of the at least one server rack, and a specified depth that is orthogonal to the lengthwise dimension.

21. The method of claim 12, wherein the at least one of the plurality of server rack racks comprises at least two server racks, each of the two server racks providing between 5 kW and 100 kW of the computing power.

* * * * *